United States Patent [19]

Tiers et al.

[11] Patent Number: 5,032,796
[45] Date of Patent: Jul. 16, 1991

[54] SOLID STATE AMPLIFIER SIMULATING VACUUM TUBE DISTORTION CHARACTERISTICS

[75] Inventors: Jerrold S. Tiers; Thomas E. Kieffer, both of St. Louis, Mo.

[73] Assignee: St. Louis Music, Inc., St. Louis, Mo.

[21] Appl. No.: 452,787

[22] Filed: Dec. 19, 1989

[51] Int. Cl.$^5$ .................. H03F 1/34; H03G 3/00
[52] U.S. Cl. ...................... 330/110; 381/61; 381/118; 381/121
[58] Field of Search .......... 330/110; 84/701; 307/562; 381/61, 109, 118, 120, 121

[56] References Cited

U.S. PATENT DOCUMENTS

| | | | |
|---|---|---|---|
| 3,973,461 | 8/1976 | Jahns | 84/1.24 |
| 4,150,253 | 4/1979 | Knoppel | 179/1 R |
| 4,175,465 | 11/1979 | Schmoll III | 84/1.26 |
| 4,439,742 | 3/1984 | Sondermeyer | 330/262 |
| 4,495,640 | 1/1985 | Frey | 381/61 |
| 4,584,700 | 4/1986 | Scholz | 381/61 |
| 4,672,671 | 6/1987 | Kennedy | 381/61 |
| 4,683,589 | 7/1987 | Scholz et al. | 381/61 |
| 4,701,957 | 10/1987 | Smith | 381/61 |
| 4,713,624 | 12/1987 | Smith | 330/118 |

FOREIGN PATENT DOCUMENTS

8807787  10/1988  World Int. Prop. O. ............ 381/61

Primary Examiner—James B. Mullins
Attorney, Agent, or Firm—Senniger, Powers, Leavitt & Roedel

[57] ABSTRACT

A preamplifier for audio frequecy electrical signals generated by a musical instrument such a guitar having distortion characteristics simulating those of a vacuum tube amplifier. A solid state amplifier has an input for receiving electrical signals generated by the musical instrument and has an output for providing an output signal. Circuitry asymmetrically clips the output signal to provide as the output signal a nonlinear asymmetrically clipped signal having harmonic content which varies as a function of the amplitude and duration of the received electrical signals. The clipped signal has musically desirable harmonic overtones and produces different tonal responses simulating the characteristics of an overdriven vacuum tube amplifier.

21 Claims, 5 Drawing Sheets

SOLID STATE AMPLIFIER SIMULATING VACUUM TUBE DISTORTION CHARACTERISTICS

BACKGROUND OF THE INVENTION

The present invention relates to electronic amplifiers for musical instruments and more particularly to a solid state operational amplifier circuit which has vacuum tube guitar amplifier distortion characteristics.

Many musicians now prefer vacuum tube preamplifiers and particularly those which can provide, as desired, linear or clean undistorted amplification or amplification which is non-linear or distorted with desired amounts of harmonic content. In part, it is believed that having a controlled amount of distortion when desired provides amplified sound that is more pleasing to the human ear and has a richer, fuller tone. Therefore, vacuum tube type guitar amplifiers which produce harmonic distortion by overdriving the tube amplifier are musically desirable in generating harmonic overtones. The dynamic response of a tube amplifier operating in the overdriven state offers the musician a very desirable "feel" or touch sensitivity by producing different tonal responses (i.e., varying harmonic content) according to the level of the input signal. Accordingly, there is a need for a solid state amplifier simulating vacuum tube distortion characteristics.

SUMMARY OF THE INVENTION

Among the objects of the present invention may be noted the provision of a solid state circuit which simulates distortion characteristics of a vacuum tube guitar amplifier; the provision of such a circuit which has a volume control; the provision of such a circuit which has a control for adjusting the gain of the circuit; the provision of a solid state preamplifier for amplifying an audio frequency electrical input signal generated by a musical instrument such as a guitar; the provision of such a preamplifier providing a nonlinear asymmetrically clipped output signal having harmonic content which varies as a function of the amplitude and duration of the input signal; and the provision of a solid state amplifier providing output signals having musically desirable harmonic overtones and producing different tonal responses simulating the characteristics of an overdriven vacuum tube amplifier.

Generally, in one form the invention provides a preamplifier for audio frequency electrical signals generated by a musical instrument such as a guitar. The preamplifier has distortion characteristics simulating those of a vacuum tube amplifier and comprises a solid state amplifier having an input for receiving electrical signals generated by the musical instrument and having an output for providing an output signal and means for asymmetrically clipping the output signal to provide as the output signal a nonlinear asymmetrically clipped signal having harmonic content which varies as a function of the amplitude and/or duration of the received electrical signals whereby the clipped signal has musically desirable harmonic overtones and produces different tonal responses simulating the characteristics of an overdriven vacuum tube amplifier.

In another form of the invention, a preamplifier for audio frequency electrical signals generated by a musical instrument such as a guitar comprises a first solid state amplifier stage having an input for receiving electrical signals generated by the musical instrument and having an output for providing as a first output signal a nonlinear asymmetrically clipped signal having harmonic content which varies as a function of the amplitude and/or duration of the received electrical signals, a second solid state amplifier stage having an input for receiving the first output signal and having an output for providing as a second output signal a nonlinear asymmetrically clipped signal having harmonic content which varies as a function of the amplitude and/or duration of the first output signal, and means for controlling the gains of the first and second stages.

In still another form of the present invention, a preamplifier for audio frequency electrical signals generated by a musical instrument such as a guitar comprises a first amplifier stage having an input for receiving electrical signals generated by the musical instrument and having an output for providing as a first output signal a nonlinear asymmetrically clipped signal having harmonic content which varies as a function of the amplitude and/or duration of the received electrical signals, a second amplifier stage having an input for receiving the first output signal and having an output for providing as a second output signal a nonlinear asymmetrically clipped signal having harmonic content which varies as a function of the amplitude and/or duration of the first output signal, and means for controlling the amplitude of the output of the first and second stages.

Other objects and features will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENTS

Figure 1:
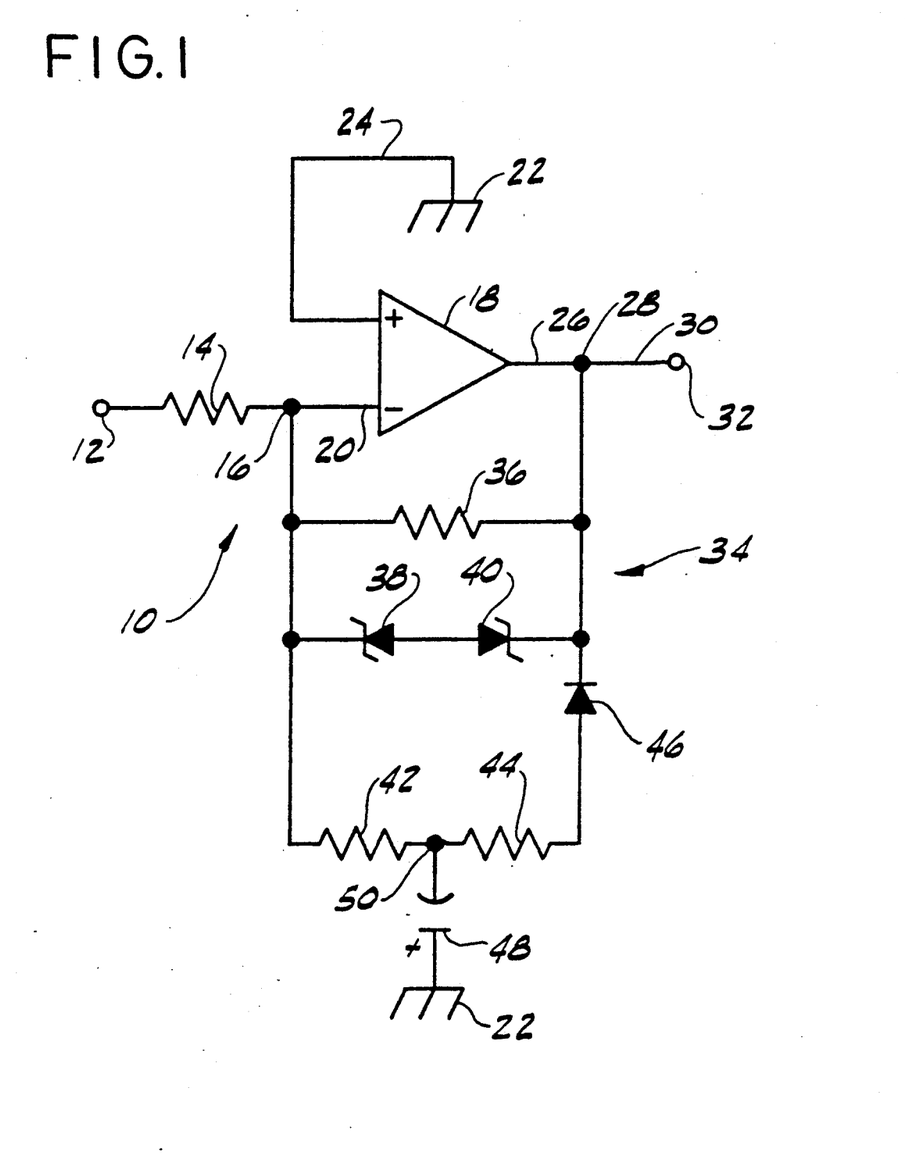
FIG. 1 is a schematic diagram of an electronic circuit according to the present invention.

Referring now to FIG. 1, a solid state electronic circuit 10 for simulating a vacuum tube guitar amplifier is illustrated. The circuit 10 includes an input terminal 12 connected to a resistor 14. Resistor 14 is also connected to a junction 16. Junction 16 is connected to an inverting input of an operational amplifier 18 via line 20. The operational amplifier 18 also has a non-inverting input connected to ground 22 via line 24. The operational amplifier 18 is connected to power supplies as required, however, this is not indicated in the figures. The operational amplifier 18 includes an output connected via line 26 to a junction 28. The junction 28 is connected via line 30 to an output terminal 32.

A feedback network 34 is connected at junctions 16 and 28. The feedback network 34 includes a feedback resistor 36 connected between junctions 16 and 28 and a pair of zener diodes 38 and 40 shunt-connected across the resistor 36. The zener diodes 38 and 40 are connected anode-to-anode in series between the input and the output of the operational amplifier 18 at junctions 16 and 28. Alternatively, zener diodes 38 and 40 may be connected in a cathode-to-cathode configuration. Zener diode 40 has a zener voltage equal to or greater than that of zener diode 38. The zener diodes 38 and 40, in this preferred embodiment, are selected such that diode 40 has a zener voltage approximately twice that of diode 38. Diode 40 also has a zener voltage which is less than half of the power supply voltage. A pair of resistors 42 and 44 and a diode 46, in series, are connected in parallel with the zener diodes 38 and 40. A capacitor 48 is connected between ground 22 and the resistors 42 and 44 at a junction 50.

The a.c. signal gain of circuit 10 is set by the selection of resistors 14 and 36. Diode 46 is used as a half wave rectifier of the output at junction 28 and output terminal 32. Amplifier 18 inverts a positive-going half wave input signal provided as an input via line 20 to a negative-going half wave output signal supplied as an output at line 26. A negative-going half wave output signal charges capacitor 48 through resistor 44 to a d.c. voltage level corresponding to the peak level of the rectified signal at a rate set by the RC time constant of resistor 36 and capacitor 48. Current is fed back through resistor 42 to the inverting input of op amp 18, which is at virtual ground, so that the DC gain is set by resistors 36 and 42. In particular, this produces an output signal 52 (see FIGS. 2A-2F) which is equal to the inverse of the input signal multiplied by the gain set by resistors 14 and 36 plus the inverse of the d.c. level across capacitor 48 multiplied by the gain set by resistors 36 and 42.

For example, FIG. 1 may be configured with the following component values:

| Component | Values |
|---|---|
| Resistor 14 | 10K ohms |
| Op amp 18 | RC 4558 |
| Resistor 36 | 100K ohms |
| Diode 38 | 3.3 V (Zener voltage) |
| Diode 40 | 6.8 V (zener voltage) |
| Resistor 42 | 10K ohms |
| Resistor 44 | 10K ohms |
| Capacitor 48 | 22 μfarads |
| Diode 46 | 1N914 |

FIGS. 2A-2F show waveforms of the output signal 52 taken at the output terminal 32. During the positive-going half wave of an input signal, the corresponding negative-going half wave of the output signal charges capacitor 48 via resistor 44. During the negative-going half wave of an input signal, the corresponding positive-going half wave of the output signal is blocked by rectifying diode 46 so that capacitor 48 is charged via resistors 36 and 42 by the negative-going half wave of the input signal. As the magnitude of the input signal increases, the inverted, amplified output signal 52 is shifted positively by an average dc level V(AVG)DC proportional to the input signal. This shift is determined by the charge on capacitor 48 and is at a rate determined by the time constant R44×C48 of resistor 44 and capacitor 48. Dashed line 54 in each of the FIGS. 2A-2F represents the average dc level to which the output signal 52 is shifted. The average dc level shift 54 increases as the signal magnitude increases as illustrated in FIGS. 2A, 2B, 2C and 2D. As the magnitude of the input signal decreases below the charge on capacitor 48, the dc level shift 54 in the output signal decreases at a rate determined by the time constant R42×C48 of resistor 42 and capacitor 48.

Figure 2A:
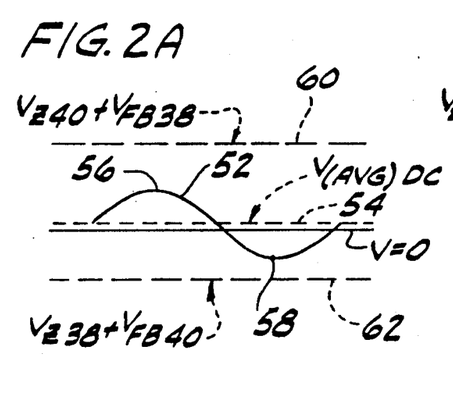
FIGS. 2A-2F and 3 are waveforms of the output signal of the electronic circuit of FIG. 1.
Figure 2B:
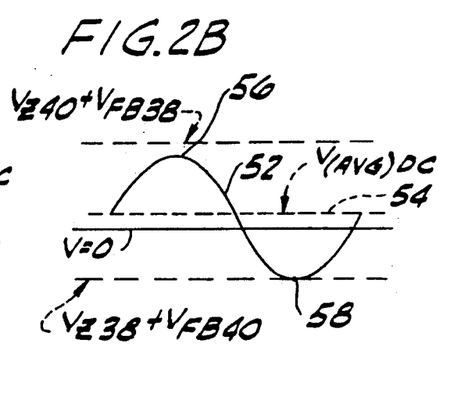
Figure 2C:
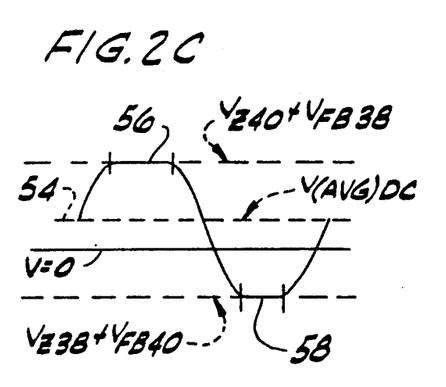
Figure 2D:
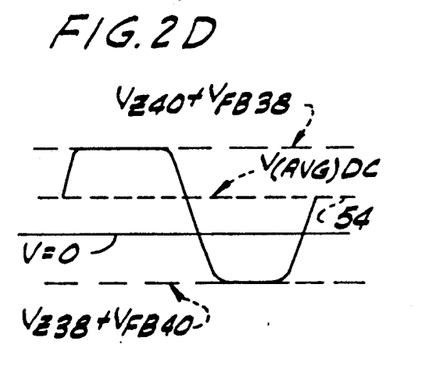

The output signal 52 has a positive peak 56 and a negative peak 58. When the positive peak 56 of the output signal 52 exceeds the zener voltage level of diode 40 plus the forward bias voltage of diode 38, diodes 40 and 38 conduct. As a result the output signal 52 is clipped, as shown in FIGS. 2C and 2D. Line 60 in each of the FIGS. 2A-2F represents the level at which the positive peak 56 is clipped which corresponds to the zener voltage level ($V_{Z40}$) of diode 40 plus the forward bias voltage ($V_{FB38}$) of diode 38. Additionally, clipping of the negative peak 58 of the output signal 52 will occur when the negative peak 58 exceeds the zener voltage level of diode 38 plus the forward bias voltage of diode 40, also shown in FIGS. 2C and 2D. Line 62 in each of the FIGS. 2A-2F represents the level at which the negative peak 58 is clipped which corresponds to the zener voltage level ($V_{Z38}$) of diode 38 plus the forward bias voltage ($V_{FB40}$) of diode 40. The output signal 52 is asymmetrically clipped due to the zener diodes 38 and 40 having different zener voltages. Asymmetrical clipping means that the magnitude of the peak of positive-going half waves is not equal to the magnitude of the peak of negative-going half waves. The DC bias shift caused by capacitor 48 partly cancels the asymmetry. As a result, the circuit tends to clip more asymmetrically as the signal is initially applied and less so after the bias has been shifted. Capacitor 48, diode 46 and resistors 44 and 42 are an example of means for shifting a bias level.

Figure 2E:
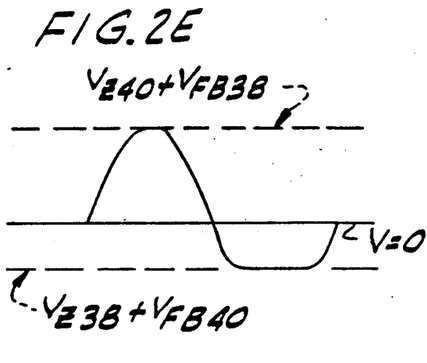
Figure 2F:
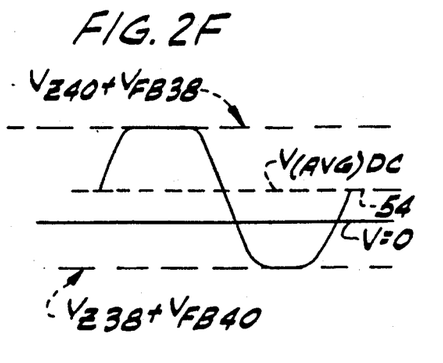

When circuit 10 is supplied with an input signal sufficient to cause clipping of the output signal 52, the resulting signal contains a harmonic series. The harmonic series varies in content (due to the varying asymmetrical clipping) with the amplitude of the input signal. The output signal 52 containing the harmonic series is similar to an overdriven tube amplifier. Additionally, the lag due to the d.c. shifting of the output signal 52 by capacitor 48 causes the initial harmonic content of the output signal 52 (as shown in FIG. 2E) during the initial input to vary. The initial harmonic content is different than the harmonic content of the output signal 52 (as shown in FIG. 2F) of a constant input signal. As a result, the output signal 52 has characteristics similar to an overdriven tube amplifier.

Figure 3:
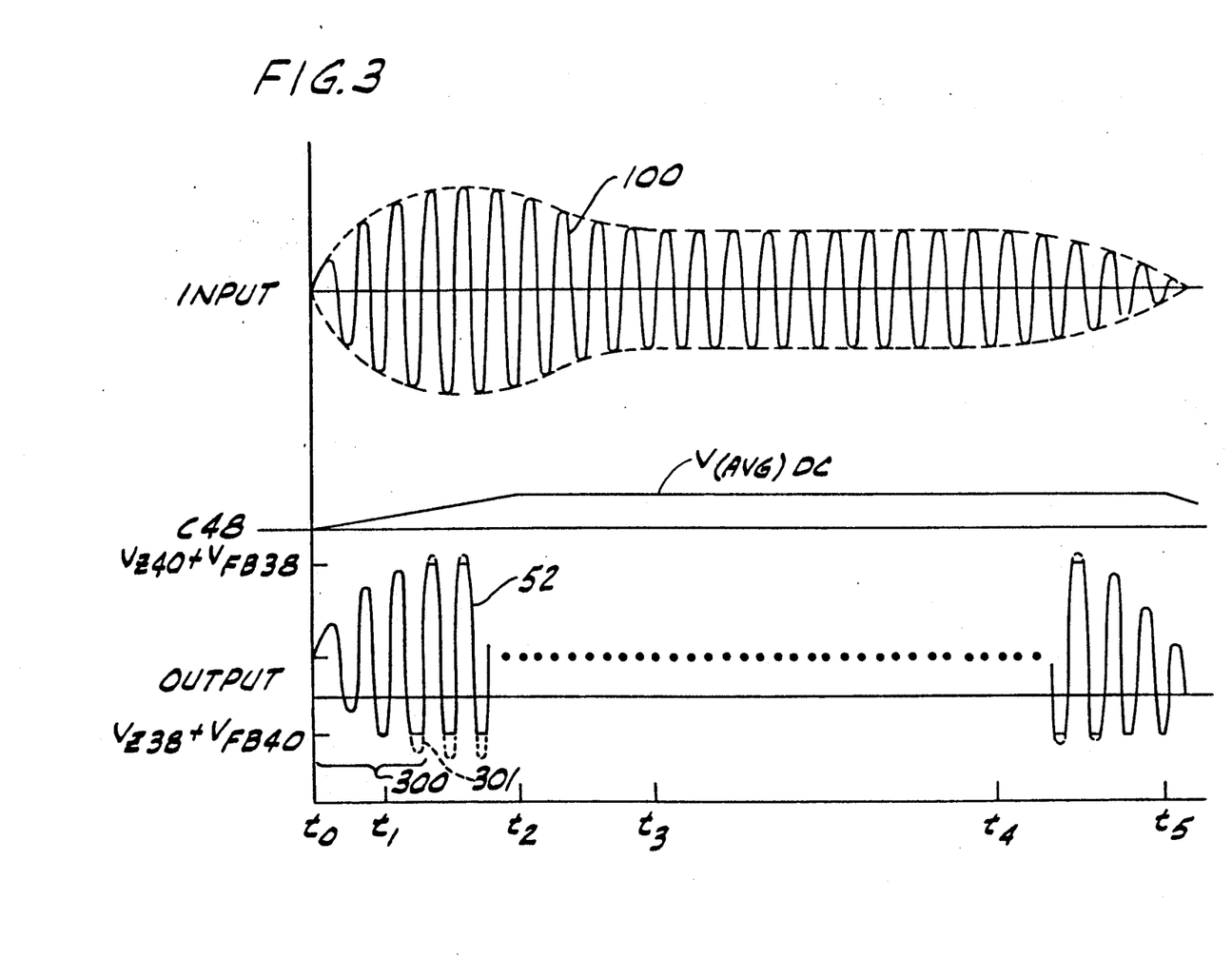

As illustrated in FIG. 3, input signal 100 represents a musical note. Between time $t_0$ and $t_2$, as capacitor C48 charges during the initial attack of signal 100, the output signal resulting therefrom varies in clipping level and harmonic content. This is because positive going half-waves are clipped at a lower amplitude than the clipping level of positive going half-waves without a bias shift. Similarly, negative going half-waves are clipped at a higher amplitude than the clipping level of negative going half-waves without a bias shift. Between $t_0$ and $t_1$ only negative going half waves 300 of the output are initially clipped. The clipped portion is indicated by the dashed lines referred to by reference character 301. Between $t_1$ and $t_2$ both positive-going and negative-going waves are clipped. Between time $t_2$ and $t_3$, when C48 is fully charged and the input signal 100 is varying in magnitude, the harmonic content similarly varies, such as illustrated in detail in FIGS. 2C, 2D, 2E and 2F. Between time $t_3$ and $t_4$, when C48 is fully charged and the input signal 100 is substantially constant in magnitude, the harmonic content remains substantially constant because the dc shift and clipping level with respect to output signal peaks remain constant. Between time $t_4$ and $t_5$, the input signal 100 decreases in magnitude such that no clipping occurs so that the output signal has no significant harmonic content. After time $t_4$, depending on the decay rate of the input signal 100 and the discharge rate of capacitor C48, some variation in the harmonic content may occur.

Circuit 10 tends to clip more asymmetrically when the signal 100 is initially applied and less after the bias has been shifted. This time variation allows a musician to vary harmonic content not only by controlling amplitude, but also by controlling the playing style. For example, a very strong attack having a high amplitude, which corresponds to a heavy picking style, will generate asymmetrical clipping and quickly shift the bias to symmetrical clipping. Alternatively, a soft picking style having a lower amplitude will tend to generate a prolonged period of lesser asymmetrical clipping by not shifting the bias as fast as the very strong attack. This is an essential feature of the vacuum tube distortion simulation effect.

The simulation holds because the typical tube amplifier is capacitively coupled, so that the bias shifts due to clipping cannot be transferred from stage to stage. As a result, each stage undergoes a bias shift in the direction which charges the coupling capacitors so as to minimize the asymmetry of clipping within that stage. This generates a variation in harmonics with amplitude and duration of signal. This circuit simulates this effect.

Feedback network 34 is an example of means for asymmetrically clipping the output signal to provide as the output signal a nonlinear asymmetrically clipped signal having harmonic content which varies as a function of the amplitude of the received electrical signals whereby the clipped signal has musically desirable harmonic overtones and produces different tonal responses simulating the characteristics of an overdriven vacuum tube amplifier. Feedback network 34 is also an example of means for feeding back at least a portion of the output signal to the input.

The most desirable effect has been found to occur when the components of circuit 10 are chosen such that the negative peak of the output signal clips before the positive half and the d.c. shift is complete within no more than 500 ms and no less than 100 ms of the initial attack of a constant amplitude input signal.

Figure 4:
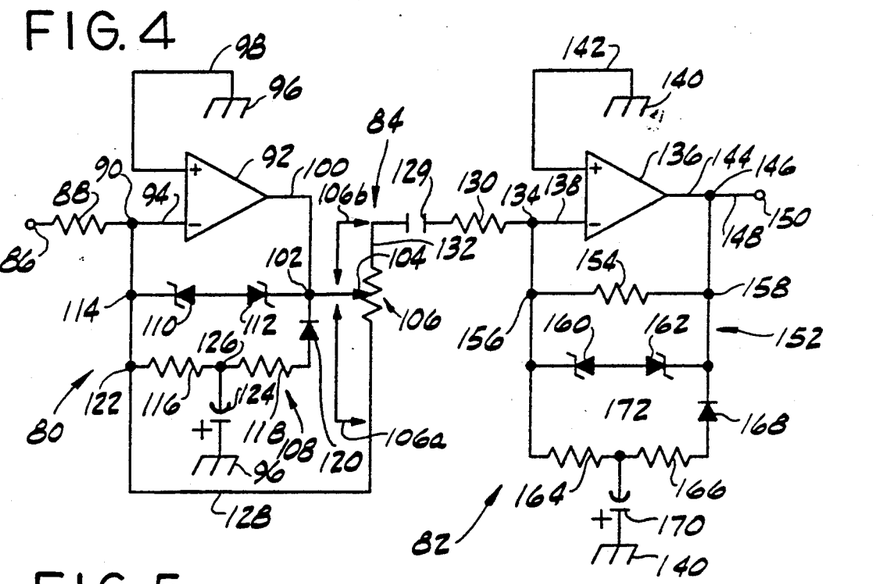
FIG. 4 is a schematic diagram of a second electronic circuit according to a second embodiment of the present invention including a control for varying the gain of the first and second stages simultaneously.

FIG. 4 shows a second embodiment of the present invention including a first stage 80 and a second stage 82 connected in series and including a control 84 for simultaneously altering the gains of both stages 80 and 82. Stage 80 includes an input terminal 86 connected to a resistor 88. Resistor 88 is also connected to a junction 90. Junction 90 is connected to an inverting input of an operational amplifier 92 via line 94. The operational amplifier 92 also has a non-inverting input connected to ground 96 via line 98. The operational amplifier 92 includes an output connected via line 100 to a junction 102. The junction 102 is connected to an arm 104 of a variable resistor 106.

A feedback network 108 is connected at junctions 90 and 102. The feedback network 108 includes a pair of zener diodes 110 and 112 which are connected between the input and the output of the operational amplifier 92 at junction 102 and a junction 114. The zener diodes 110 and 112 are connected anode-to-anode in series between the junctions 102 and 114. Zener diode 112 has a zener voltage greater than that of zener diode 110. In one preferred embodiment, the zener diodes 110 and 112 are selected such that diode 112 has a zener voltage approximately twice that of diode 110. Preferably, diode 112 also has a zener voltage which is less than half of the power supply voltage. A pair of resistors 116 and 118 and a diode 120 are connected in parallel with the zener diodes 110 and 112 at junctions 102 and a junction 122. A capacitor 124 is connected between the resistors 116 and 118 at a junction 126 and ground 96. One portion 106a of a variable resistor 106 (such as a 100K ohm resistor) of control 84 is connected to junction 122 via line 128. As a result, portion 106a functions as a feedback resistor between the output and input of amplifier 92. The other portion 106b of the variable resistor 106 is connected to a coupling capacitor 129 (such as a 1 µfarad capacitor) and a resistor 130 (such as a 10K ohm resistor) at the input of stage 82 via line 132. The input of stage 82 receives the output of stage 80.

Stage 82 includes the resistor 130 connected to a junction 134. Junction 134 is connected to an inverting input of an operational amplifier 136 via line 138. The operational amplifier 136 also has a non-inverting input connected to ground 140 via line 142. The operational amplifier 136 includes an output connected via line 144 to a junction 146. The junction 146 is connected via line 148 to an output terminal 150.

A feedback network 152 is connected at junctions 134 and 146. The feedback network 152 includes a feedback resistor 154 connected between a pair of junctions 156 and 158 which are connected to junctions 134 and 146, respectively. A pair of zener diodes 160 and 162 are shunt-connected across the resistor 154. The zener diodes 160 and 162 are connected anode-to-anode in series between the input and the output of the operational amplifier 136. Zener diode 162 has a zener voltage greater than that of zener diode 160. In one preferred embodiment, the zener diodes 160 and 162 are selected such that diode 162 has a zener voltage approximately twice that of diode 160. Preferably, diode 162 also has a zener voltage which is less than half of the power supply voltage. A pair of resistors 164 and 166 and a diode 168 are connected in parallel with the zener diodes 160 and 162. A capacitor 170 is connected between the resistors 164 and 166 at a junction 172 and ground 140.

Stages 80 and 82 both operate in a similar manner as circuit 10. Stages 80 and 82 both produce asymmetrically clipped output signals. In operation, the adjustment of the arm 104 of the variable resistor 106 simultaneously controls the gains of both stages 80 and 82. Adjusting the arm 104 downward corresponds to decreasing the a.c. signal gain of operational amplifier 92 which is set by resistors 88 and 106a. The a.c. signal gain of operational amplifier 136 is also decreased by movement of the arm 104 in the downward direction. The a.c. signal gain of operational amplifier 136 is set by the series resistance of resistors 106d and 130 and resistor 154. If the arm 104 is adjusted in the upward direction, the a.c. signal gain of operational amplifier 92 increases due to the increased resistance of resistor 106. Additionally, the a.c. signal gain of operational amplifier 136 increases due to the decreased resistance of the series combination of resistors 106 and 130.

Control 84 is an example of means for controlling the gains of the first stage 80 and the second stage 82. Variable resistor 106 is an example of means for simultaneously altering the respective gains of the first and second stages.

When the two stages 80 and 82 are combined, the two dc shifts and the asymmetrical clipping effects are applied to opposite half-waves of the input signal since the two stages 80 and 82 are similar. As a result, stage 80 primarily clips positive half waves and stage 82 primarily clips negative half waves. The output signal of stage 80 taken at junction 102 is inverted by the operational amplifier 92. The output signal of stage 82 taken at output terminal 150 inverts the signal from stage 80. This combination of stages 80 and 82 in series has desirable effects with regard to the perceived smoothness of the distortion and harmonic generation of the output signal from stage 82. As the magnitude of the input signal increases, the effect of stage 80 increases as compared to the effect of stage 82. This permits the musician to obtain dynamic effects in that the harder a string is played, the greater the effect of stage 80. This makes is possible for the musician to modulate the amount of effect and the resulting sound based on playing style. For example, a soft note would be distorted by the second stage 82 only. A strong note would initially distort both stages 80 and 82. As the note decays, stage 80 would drop out of distortion, leaving only stage 82 distorted. The nature of the harmonics generated is different in these two cases, similar to the effect of multi-stage tube amplifiers. Additionally, the total gain of the two circuits, 80 and 82, connected in series, is greater than the gain of a single circuit, allowing greater versatility of effects.

Stages 80 and 82 may be used to construct a complete amplification system having volume controls and tone controls. Amplification and tone shaping circuitry (not shown) is provided to condition the input signal before it is provided at input terminal 86 and to condition the output signal after it is output from output terminal 150.

Figure 5:
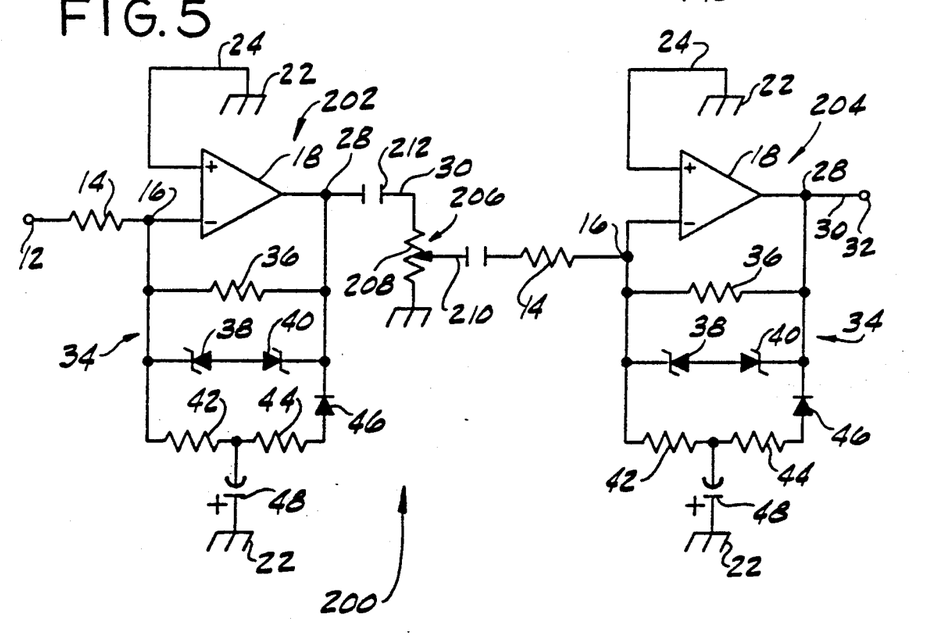
FIG. 5 is a schematic diagram of a third electronic circuit according to a third embodiment of the present invention having a volume control.

FIG. 5 shows a third embodiment according to the present invention. In FIG. 5, the same reference characters have been used as the reference characters of FIG. 1 wherever possible. A circuit 200 includes a first stage 202 and a second stage 204 having a volume control 206. Stages 202 and 204 are similar in construction to circuit 10 except that the output signal of stage 202 is provided via line 30 to a variable resistor 208 (such as a 100K ohm resistor) of the volume control 206. An arm 210 of variable resistor 208 is connected to resistor 14 of stage 204. Adjusting arm 210 controls the amplitude of the output signal taken at output terminal 32 of stage 204. Volume control 206 is an example of means for attenuating the output of the first stage. Alternatively, the volume control 206 may be placed at the input between input terminal 12 and resistor 14. A coupling capacitor 212 (such as a 1 μfarad capacitor) is connected between junction 28 and the variable resistor 208. Another coupling capacitor 214 (such as a 1 μfarad capacitor) is connected at the input of the second stage 204 between the arm 210 and the resistor 14.

Circuit 200 may also be used to construct a complete amplification system having volume controls and tone controls. Amplification and tone shaping circuitry (not shown) is provided to condition the input signal before it is provided at input terminal 12 and to condition the output signal after it is output from output terminal 32. Circuit 200 may also include gain and tone shaping circuitry (not shown) so as to provide an undistorted output signal at normal levels while distorting the output signal at higher input signal levels. This would provide a "soft limiting" effect associated with vacuum tube amplifier circuitry. The delayed change in the harmonic structure is particularly important in this type of operation since the distortion is not sustained long enough to activate the change. Circuitry 200 may be used with any amplifier to provide the desirable characteristic termed "warmth" of vacuum tube amplifiers which is commonly associated with vacuum tube amplifier circuitry having a characteristic "forgiving" type of distortion.

Figure 6:
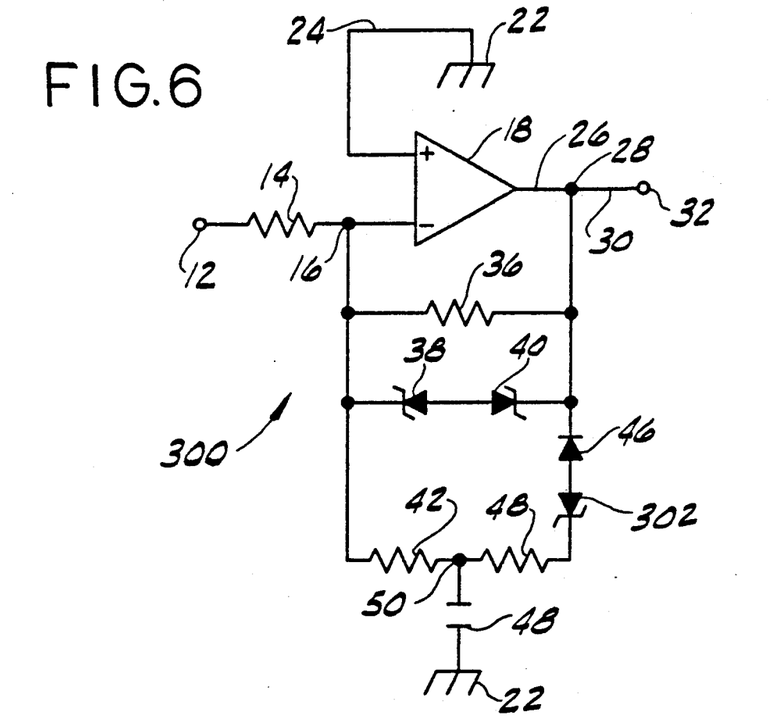
FIG. 6 is a schematic diagram of a fourth electronic circuit according to a fourth embodiment of the present invention.

FIG. 6 shows a fourth embodiment according to the present invention. In FIG. 6, the same reference characters have been used as the reference characters of FIG. 1 whenever possible. A circuit 300 includes a zener diode 302 in series between diode 46 and resistor 48. Zener diode 302 links the d.c. voltage shift with clipping. There is no shift unless clipping due to one or both of the zener diodes 42 and 48 is present. For example, diode 302 may have a zener voltage of 3.3 volts to prevent a voltage shift unless diode 38 is clipping.

Although not shown, the circuit 10 may be modified to shift the bias by applying a voltage to the positive terminal of the amplifier 18. Circuit 200 may be modified by removing the volume control 206 and directly connecting the output of the first stage 202 to the input of the second stage 204.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A preamplifier for audio frequency electrical signals generated by a musical instrument such as a guitar, said preamplifier having distortion characteristics simulating those of a vacuum tube amplifier, said preamplifier comprising:
   a solid state amplifier having an input for receiving electrical signals generated by the musical instrument and having an output for providing an output signal; and
   means for asymmetrically clipping the output signal to provide a nonlinear output signal having harmonic content which varies as a function of the amplitude and/or duration of the received electrical signals and having decreasing clipping asymmetry over time in response to received electrical signals of increasing amplitude and/or increasing duration whereby the clipped signal has musically desirable harmonic overtones and produces different tonal responses simulating the characteristics of an overdriven vacuum tube amplifier.

2. The preamplifier of claim 1 further comprising means for feeding back at least a portion of the output signal to the input.

3. The preamplifier of claim 2 wherein the asymmetrically clipping means comprises means for clipping the output signal with respect to a bias level and means for shifting the bias level.

4. The preamplifier of claim 3 wherein the shifting means shifts to the bias level within 500 milliseconds of an initial attack of a constant amplitude signal applied to the input of the solid state amplifier.

5. The preamplifier of claim 3 wherein the asymmetrical clipping means comprises a first zener diode and a second zener diode connected anode-to-anode in series between the input and the output of the amplifier, the first diode having a zener voltage greater than that of the second zener diode.

6. The preamplifier of claim 5 wherein the feedback means comprises a feedback resistor, wherein the series connected zener diodes are shunt-connected across said resistor, and wherein the first diode has a zener voltage approximately twice that of the second zener diode.

7. A preamplifier for audio frequency electrical signals generated by a musical instrument such as a guitar, said preamplifier comprising:
a first solid state amplifier stage having an input for receiving electrical signals generated by the musical instrument and having an output for providing as a first output signal a nonlinear asymmetrically clipped signal having harmonic content which varies as a function of the amplitude and/or duration of the received electrical signals;
a second solid state amplifier stage having an input for receiving the first output signal and having an output for providing as a second output signal a nonlinear asymmetrically clipped signal having harmonic content which varies as a function of the amplitude and/or duration of the first output signal; and
means for simultaneously controlling the gains of the first and second stages.

8. The preamplifier of claim 7 wherein the gain controlling means comprises means, connected between the output of the first stage and the input of the second stage, for simultaneously increasing or simultaneously decreasing the respective gains of the first and second amplifier stages.

9. The preamplifier of claim 7 wherein the first amplifier stage includes means for primarily clipping positive half waves of the received electrical signals and the second amplifier stage includes means for primarily clipping negative half waves of the received electrical signals.

10. The preamplifier of claim 7 wherein the gain altering means comprises a variable resistor having a first part connected between the input and the output of the first amplifier stage and having the remaining part in series with the input of the second amplifier stage and wherein increasing the resistance of the first part increases the gain of the first amplifier stage and decreases the resistance of the remaining part to increase the gain of the second amplifier stage and decreasing the resistance of the first part decreases the amplification of the first amplifier stage and increases the resistance of the remaining part to decrease the gain of the second amplifier stages.

11. The preamplifier of claim 7 wherein each stage includes means for clipping its respective output signal with respect to a bias level and means for shifting the bias level.

12. The preamplifier of claim 11 wherein the shifting means shifts to the bias level within 500 milliseconds of an initial attack of a constant amplitude signal applied to the input of the solid state amplifier.

13. The preamplifier of claim 11 wherein each of the clipping means comprises a first zener diode and a second zener diode connected anode-to-anode in series between the input and the output of its respective amplifier stage, the first diode having a zener voltage greater than that of the second zener diode.

14. The preamplifier of claim 13 wherein the second stage includes a feedback resistor and wherein the series connected zener diodes are shunt-connected across said resistor, and wherein the first diode has a zener voltage approximately twice that of the second zener diode in each of the stages.

15. A preamplifier for audio frequency electrical signals generated by a musical instrument such as a guitar, said preamplifier comprising:
a first amplifier stage having an input for receiving electrical signals generated by the musical instrument and having an output for providing as a first output signal a nonlinear asymmetrically clipped signal having harmonic content which varies as a function of the amplitude and/or duration of the received electrical signals;
means for attenuating the output signal of the first stage; and
a second amplifier stage having an input for receiving the attenuated first output signal and having an output for providing as a second output signal a nonlinear asymmetrically clipped signal having harmonic content which varies as a function of the amplitude and/or duration of the first output signal, said second amplifier stage asymmetrically clipping the half-wave opposite to the half-wave clipped by the first amplifier stage.

16. The preamplifier of claim 15 wherein the attenuating means comprises a variable resistor connected between the output of the first amplifier stage and the input of the second amplifier stage to control the amplitude of the signal applied to the input of the second amplifier stage.

17. The preamplifier of claim 15 wherein the output signal of each stage has decreasing clipping asymmetry over time in response to an increasing amplitude and/or increasing duration in the respective electrical signals received by the input of each stage.

18. A preamplifier for audio frequency electrical signals generated by a musical instrument such as a guitar, said preamplifier comprising:
a first amplifier stage having an input for receiving electrical signals generated by the musical instrument and having an output for providing as a first output signal a nonlinear asymmetrically clipped signal having harmonic content which varies as a function of the amplitude and/or duration of the received electrical signals;
means for attenuating the output signal of the first stage;
a second amplifier stage having an input for receiving the attenuated first output signal and having an output for providing as a second output signal a nonlinear asymmetrically clipped signal having harmonic content which varies as a function of the amplitude and/or duration of the first output signal; and
wherein each amplifier stage includes means for clipping its respective output signal with respect to a bias level and means for shifting the bias level.

19. The preamplifier of claim 18 wherein each of the shifting means shifts to the bias level within 500 milliseconds of an initial attack of a constant amplitude signal applied to the input of the solid state amplifier.

20. The circuit of claim 18 wherein each of the clipping means comprises a first zener diode and a second zener diode connected anode-to-anode in series between the input and the output of its respective amplifier stage, the first diode having a zener voltage greater than that of the second zener diode.

21. The preamplifier of claim 20 wherein each of the stages includes a feedback resistor and wherein the series connected zener diodes are shunt-connected across said resistor, and wherein the first diode has a zener voltage approximately twice that of the second zener diode.

* * * * *